United States Patent
Kruglick

(10) Patent No.: US 9,318,192 B2
(45) Date of Patent: Apr. 19, 2016

(54) PHASE CHANGE MEMORY THERMAL MANAGEMENT WITH ELECTROCALORIC EFFECT MATERIALS

(71) Applicant: Empire Technology Development LLC, Wilmington (DE)

(72) Inventor: Ezekiel Kruglick, Poway, CA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 505 days.

(21) Appl. No.: 13/810,324

(22) PCT Filed: Sep. 18, 2012

(86) PCT No.: PCT/US2012/055872
§ 371 (c)(1),
(2) Date: Jan. 15, 2013

(87) PCT Pub. No.: WO2014/046640
PCT Pub. Date: Mar. 27, 2014

(65) Prior Publication Data
US 2014/0078823 A1    Mar. 20, 2014

(51) Int. Cl.
*G11C 13/00* (2006.01)
*G11C 7/04* (2006.01)

(52) U.S. Cl.
CPC .............. *G11C 13/0004* (2013.01); *G11C 7/04* (2013.01); *G11C 13/0069* (2013.01); *G11C 2013/008* (2013.01)

(58) Field of Classification Search
CPC .............. G11C 13/0004; G11C 13/00; G11C 13/0016; G11C 13/0069; G11C 2013/008; G01K 17/00
See application file for complete search history.

(56) References Cited

U.S. PATENT DOCUMENTS

| | | | |
|---|---|---|---|
| 2,978,875 A | 4/1961 | Lackey et al. | |
| 4,673,030 A | 6/1987 | Basiulis | |
| 4,757,688 A | 7/1988 | Basiulis et al. | |

(Continued)

FOREIGN PATENT DOCUMENTS

| | | |
|---|---|---|
| CN | 86101652 A | 11/1986 |
| CN | 1237791 A | 12/1999 |

(Continued)

OTHER PUBLICATIONS

Epstein et al., Electrocaloric Devices Based on Thin-Film Heat Switches, 2009, Journal of Applied Physics 106, 7 pp.*

(Continued)

*Primary Examiner* — Toan Le
(74) *Attorney, Agent, or Firm* — Maschoff Brennan

(57) ABSTRACT

Technologies are generally described herein for managing heat within a phase change memory (PCM) structure utilizing electrocaloric effect materials. Some example PCM structures may include an electrocaloric effect material layer thermally coupled to an array of PCM cells. The electrocaloric effect material layer may be segmented so that activation of each segment is coordinated with a subset of the PCM cells within the array. While excess heat emanates from a PCM cell during memory operations, a corresponding electrocaloric effect material segment may be activated to decrease the thermal resistance of the electrocaloric effect material, which transfers the excess heat away from the neighboring PCM cells.

20 Claims, 6 Drawing Sheets

(56) References Cited

U.S. PATENT DOCUMENTS

| | | | |
|---|---|---|---|
| 4,929,516 A | 5/1990 | Pryor et al. |
| 5,040,381 A | 8/1991 | Hazen |
| 5,229,566 A | 7/1993 | Alexandres |
| 5,515,238 A | 5/1996 | Fritz et al. |
| 5,690,849 A | 11/1997 | DeVilbiss et al. |
| 6,105,381 A | 8/2000 | Ghoshal |
| 6,285,079 B1 | 9/2001 | Kunikiyo |
| 6,300,150 B1 | 10/2001 | Venkatasubramanian |
| 6,556,752 B2 | 4/2003 | Fang et al. |
| 6,588,215 B1 | 7/2003 | Ghoshal |
| 6,711,904 B1 | 3/2004 | Law et al. |
| 6,877,325 B1 | 4/2005 | Lawless |
| 7,293,416 B2 | 11/2007 | Ghoshal |
| 7,305,839 B2 | 12/2007 | Weaver, Jr. |
| 7,421,845 B2 | 9/2008 | Bell |
| 7,475,551 B2 | 1/2009 | Ghoshal |
| 7,900,450 B2 | 3/2011 | Gurin |
| 7,951,467 B2 | 5/2011 | Tsushima |
| 8,869,541 B2 | 10/2014 | Heitzler et al. |
| 2001/0023591 A1 | 9/2001 | Maeda et al. |
| 2003/0033818 A1 | 2/2003 | Kucherov et al. |
| 2005/0045702 A1 | 3/2005 | Freeman et al. |
| 2005/0086948 A1 | 4/2005 | Milke Rojo et al. |
| 2005/0109041 A1 | 5/2005 | Tanaka |
| 2005/0269065 A1 | 12/2005 | Chen |
| 2006/0092694 A1 | 5/2006 | Choi et al. |
| 2006/0137359 A1 | 6/2006 | Ghoshal |
| 2006/0139116 A1 | 6/2006 | Niki et al. |
| 2006/0201161 A1 | 9/2006 | Hirai et al. |
| 2007/0007613 A1 | 1/2007 | Wang et al. |
| 2008/0303375 A1 | 12/2008 | Carver |
| 2009/0139244 A1 | 6/2009 | Ullo et al. |
| 2009/0258248 A1 | 10/2009 | Tsushima |
| 2009/0293499 A1 | 12/2009 | Bell et al. |
| 2009/0301541 A1 | 12/2009 | Watts |
| 2009/0308081 A1 | 12/2009 | Ouyang et al. |
| 2010/0037624 A1 | 2/2010 | Epstein et al. |
| 2010/0096113 A1 | 4/2010 | Varanasi et al. |
| 2010/0140772 A1 | 6/2010 | Lin et al. |
| 2010/0175392 A1 | 7/2010 | Malloy et al. |
| 2010/0212327 A1 | 8/2010 | Barve et al. |
| 2010/0218511 A1 | 9/2010 | Rockenfeller |
| 2010/0230653 A1 | 9/2010 | Chen |
| 2010/0236258 A1 | 9/2010 | Heitzler et al. |
| 2011/0016885 A1 | 1/2011 | Zhang et al. |
| 2011/0063904 A1 | 3/2011 | Chang et al. |
| 2011/0113791 A1 | 5/2011 | Kruglick |
| 2011/0146308 A1 | 6/2011 | Casasanta |
| 2011/0203839 A1 | 8/2011 | Iwamoto |
| 2011/0309463 A1 | 12/2011 | Kruglick |
| 2012/0055174 A1 | 3/2012 | Kruglick |
| 2012/0267090 A1 | 10/2012 | Kruglick |
| 2013/0067934 A1 | 3/2013 | Kruglick |
| 2013/0067935 A1 | 3/2013 | Kruglick |

FOREIGN PATENT DOCUMENTS

| | | | |
|---|---|---|---|
| CN | 1992358 A | 7/2007 |
| CN | 2932237 A | 8/2007 |
| CN | 101246947 A | 8/2008 |
| CN | 101291769 A | 10/2008 |
| CN | 101587934 A | 11/2009 |
| CN | 101842647 A | 9/2010 |
| EP | 0 194 475 A2 | 9/1986 |
| GB | 2420662 A | 5/2006 |
| JP | H11177151 A | 7/1999 |
| WO | 2006056809 A1 | 6/2006 |
| WO | 2008/137940 A1 | 11/2008 |
| WO | 2009126344 A2 | 10/2009 |

OTHER PUBLICATIONS

Bai et al., Direct Measurement of Giant Electrocaloric Effect in BaTiO3 Multilayer Thick Film Structure Beyond Theoretical Prediction, 2010, Applied Physics Letters 96, 3 pp.*

Chinese First Office Action dated Apr. 7, 2015 as received in Application No. 201180073606.2.

Chinese First Office Action dated Apr. 9, 2015 as received in Application No. 201180073616.6.

Arik, Mehmet, "Enhancement of Pool Boiling Critical Heat Flux in Dielectric Liquids," Doctoral Dissertation submitted to University of Minnesota, Feb. 2001.

Final Office Action mailed Aug. 2, 2012 in U.S. Appl. No. 12/999,684, Ezekiel Kruglick, filed Dec. 17, 2010.

Final Office Action mailed Jul. 16, 2014 in U.S. Appl. No. 13/384,859, Ezekiel Kruglick, filed Jan. 19, 2012.

International Preliminary Report on Patentability for PCT application No. PCT/US2010/039200 mailed on Dec. 19, 2012.

International Preliminary Report on Patentability for PCT application No. PCT/US2010/047887 mailed on Mar. 5, 2013.

International Preliminary Report on Patentability for PCT application No. PCT/US2011/052569 mailed on Mar. 25, 2014.

International Preliminary Report on Patentability for PCT application No. PCT/US2011/033220 mailed on Oct. 22, 2013.

International Preliminary Report on Patentability for PCT application No. PCT/US2011/052577 mailed on Mar. 25, 2014.

International Preliminary Report on Patentability for PCT application No. PCT/US2012/047013 mailed on Jan. 20, 2015.

Non Final Office Action mailed Jan. 13, 2015 in U.S. Appl. No. 13/813,588, Ezekiel Kruglick, filed Jan. 31, 2013.

Non-Final OA mailed Aug. 16, 2013, in U.S. Appl. No. 12/999,182, Ezekiel Kruglick, filed on Dec. 15, 2010.

Non-Final Office Action mailed Aug. 29, 2013 in U.S. Appl. No. 12/999,182, Ezekiel Kruglick, filed Dec. 15, 2010.

Non-Final Office Action mailed Mar. 16, 2012 in U.S. Appl. No. 12/999,684, Ezekiel Kruglick, filed Dec. 17, 2010.

Non-Final Office Action mailed Nov. 7, 2013 in U.S. Appl. No. 13/384,859, Ezekiel Kruglick, filed Jan. 19, 2012.

Non-Final Office Action mailed Sep. 12, 2013 in U.S. Appl. No. 13/386,736, Ezekiel Kruglick, filed Jan. 24, 2012.

Notice of Allowance mailed Jan. 27, 2014 in U.S. Appl. No. 13/386,736, Ezekiel Kruglick, filed Jan. 24, 2012.

Notice of Allowance mailed Jan. 30, 2014 in U.S. Appl. No. 12/999,182, Ezekiel Kruglick, filed Dec. 15, 2010.

Notice of Allowance mailed May 5, 2014 in U.S. Appl. No. 12/999,182, Ezekiel Kruglick, filed Dec. 15, 2010.

Notice of Allowance mailed on Nov. 17, 2014, in U.S. Appl. No. 13/145,948, Ezekiel Kruglick, filed Jul. 22, 2011.

Sinyavskii, Y. V., "Electrocaloric Refrigerators: A Promising Alternative to Current Low-Temperature Apparatus," Chemical and Petroleum Engineering, vol. 31, No. 6, pp. 295-306 (Jan. 1, 1995).

Supplementary European search report for EP2583320 mailed on dated Jan. 2, 2014.

Takeshi M., et al., "Ferroelectric properties of an epitaxial lead zirconate titanate thin film deposited by a hydrothermal method below the Curie temperature," Applied Physics Letters, vol. 84, Issue: 25, Jun. 21, 2004, pp. 5094-5096.

U.S. Notice of Allowance dated Jan. 27, 2014 in U.S. Appl. No. 13/386,736.

U.S. Notice of Allowance dated Jan. 30, 2014 in U.S. Appl. No. 12/999,182.

U.S. Office Action dated Mar. 16, 2012 in U.S. Appl. No. 12/999,684.

U.S. Official Action dated Apr. 22, 2014 in U.S. Appl. No. 13/145,948.

U.S. Official Action dated Nov. 21, 2013 in U.S. Appl. No. 13/145,948.

U.S. Official Action Dated Nov. 7, 2013 in U.S. Appl. No. 13/384,859.

International Search Report & Written Opinion dated Nov. 20, 2012 in PCT Application No. PCT/US12/55872.

G. Servalli, "A 45nm generation phase change memory technology," in IEDM Tech. Dig., pp. 5.7.1-5.7.4, 2009.

Dominic Lencer, Martin Salinga, and Matthias Wuttig, "Design Rules for Phase-Change Materials in Data Storage Applications," Advanced Materials 23, No. 18 (May 2011): 2030-2058.

(56) References Cited

OTHER PUBLICATIONS

S. B Kim et al., "Thermal disturbance and its impact on reliability of phase-change memory studied by the micro-thermal stage," in Reliability Physics Symposium (IRPS), 2010 IEEE International, n.d., 99-103.
"Heat Diode Paves the Way for Thermal Computing," Emerging Technology From the arXiv, accessed at http://www.technologyreview.com/view/415672/heat-diode-paves-the-way-for-thermal-computing/?a=f, Oct. 9, 2009, pp. 1-2.
"Thermal Analysis of Semiconductor Systems," White Paper, Freescale Semiconductor, Inc., pp. 24 (2008).
Akcay, G., et al., "Influence of mechanical boundary conditions on the electrocaloric properties of ferroelectric thin films," Journal of Applied Physics, vol. 103, pp. 24104-1-24104-7, American Institute of Physics (2008).
Arik, M., et al., "Enhancement of Pool Boiling Critical Heat Flux in Dielectric Liquids by Microporous Coatings," International Journal of Heat and Mass Transfer, vol. 50. Issue 5-6, pp. 997-1009 (2007).
Ashley, S., "Cool Polymers: Toward the Microwave Over Version of the Refrigerator," Scientific America Magazine, accessed at http://www.sciam.com/article.cfm?id=cool-polymers&print=true, Oct. 3, 2008, pages.
D.A. McNeil "Pressure Drop and Heat Transfer Distributions Around a Bundle of Drop and Heat Transfer Distributions of Plasma Treated Tubes Condensing Dropwise," EPSRC, UK Department of trade and Industry Report, pp. 2 (Dec. 1999).
Dames, C., "Solid-State Thermal Rectification with Existing Bulk Materials," Journal Heat Transfer, vol. 131, Issue 6, pp. 7 (2009).
Epstein, R.I., "Photonic and Electronic Cooling," International Conference on Emerging Trends in Electronic and Photonic Devices & Systems, ELECTRO '09, pp. 1-4 (2009).
Fett, T., et al., "Nonsymmetry in the Deformation Behaviour PZT," Journal of Materials Science Letters, vol. 17, Issue 4, pp. 261-265 (1998).
Kobayashi, W., et al., "An Oxide Thermal Rectifier," Applied Physics Letters, vol. 95, Issue 17, pp. 1-4 (2009).
Lankford, K., "Heat Switches," in Spacecraft Thermal Control Handbook, Chapter 10, Second Edition, pp. 353-371, Gilmore, D.G., eds., The Aerospace Corporation (2002).
Li, B., et al., "Interface Thermal Resistance Between Dissimilar Anharmonic Lattices," Physics Review Letters, vol. 95, pp. 104302-1-104302-4, The American Physical Society (2005).
Mischenko, A.S., et. al., "Giant Electrocaloric Effect in Thin-Film PbZr0.95Ti0.05O3" Science, vol. 311, No. 5765, pp. 1270-1271 (2006).
Morita, T., et al., "Ferroelectric properties of an epitaxial lead zirconate titanate thin film deposited by a hydrothermal method below the Curie temperature," Applied Physics Letters, vol. 84, Issue 25, pp. 5094-5096 (2004).

Neese, B., et al., "Large Electrocaloric Effect in Ferroelectric Polymers Near Room Temperature," Science, vol. 321, No. 5890, pp. 821-823 (2008).
Peyrard, M., "The Design of a Thermal Rectifier," Europhysics Letters, vol. 76, No. 49. pp. 1-7 (2006).
Salam, B., et al., "Pressure Drop Measurements in a Low Pressure Steam Condenser with a Horizontal Bundle of Staggered Tubes," Applied Thermal Engineering, vol. 24, Issue 8-9, pp. 1365-1379 (2004).
Sebald, G., et al., "Pyroelectric Energy Conversion; Optimization Principles," IEEE Transactions on Ultrasonics, Ferroelectrics, and Frequency Control, vol. 55, No. 3, pp. 538-551 (2008).
Seim, H., et al., "Growth of LaCoO3 Thin Films from β-diketonate precursors," Applied Surface Science, vol. 112, pp. 243-250 (1997).
Sharpe, W.N. Jr. and Sharpe, W. I., "Atomic Force Microscopy in Solid Mechanics ," in Springer Handbook of Experimental Solid Mechanics, Chapter 17.2.5, PZT Actuator Nonlinearities, pp, 420-423 (2008).
Surana, R.R., "High Strain Functionally Graded Barium Titanate and its Mathematical Characterization," A dissertation submitted to the Division of Research and Advanced Studies of the University of Cincinnati, pp. 105 (2004).
Terraneo, M., et al., "Controlling the Energy Flow in Nonlinear Lattices: A Model for a Thermal Rectifier," Physical Review Letters, vol. 88, No. 9, pp. 1-4 (2002).
Vereshchagina, E., "Investigation of Solid-State Cooler Based on Electrocaloric Effect," Lappeenranta university of Technology, MS Thesis, pp. 131 (2007).
Waller, D., et al., "The effect of pulse duration and oxygen partial pressure on La0.7Sr0.3CoO3-delta and La0.7Sr0.3Co0.2Fe0.8O3-delta$ films prepared by laser ablation," Solid State Ionics, vol. 134, No. 1-2, pp. 119-125 (2000).
International Search Report and Written Opinion for International Patent Application No. PCT/US2012/047013 mailed Oct. 15, 2012.
International Search Report and Written Opinion for International Patent Application No. PCT/US2011/033220 mailed Jun. 4, 2011.
International Search Report and Written Opinion for International Patent Application No. PCT/US2011/052577 mailed Dec. 21, 2011.
International Search Report and Written Opinion for International Patent Application No. PCT/US2010/039200 mailed Aug. 11, 2010.
International Search Report and Written Opinion for International Patent Application No. PCT/US2011/052569 mailed Dec. 20, 2011.
International Search Report for International Patent Application No. PCT/US2010/047887 mailed Nov. 12, 2010.
U.S. Official Action dated Jun. 19, 2015 in U.S. Appl. No. 13/813,588.
U.S. Notice of Allowance dated Jun. 22, 2015 in U.S. Appl. No. 13/145,948.

* cited by examiner

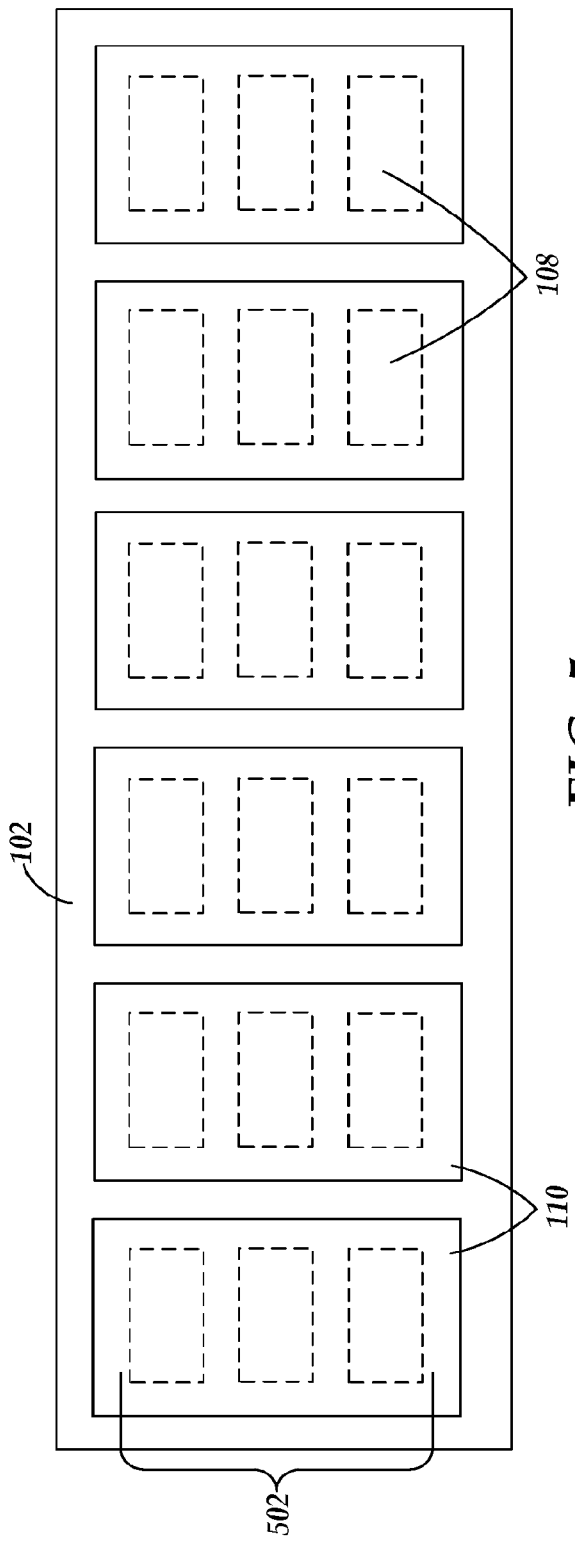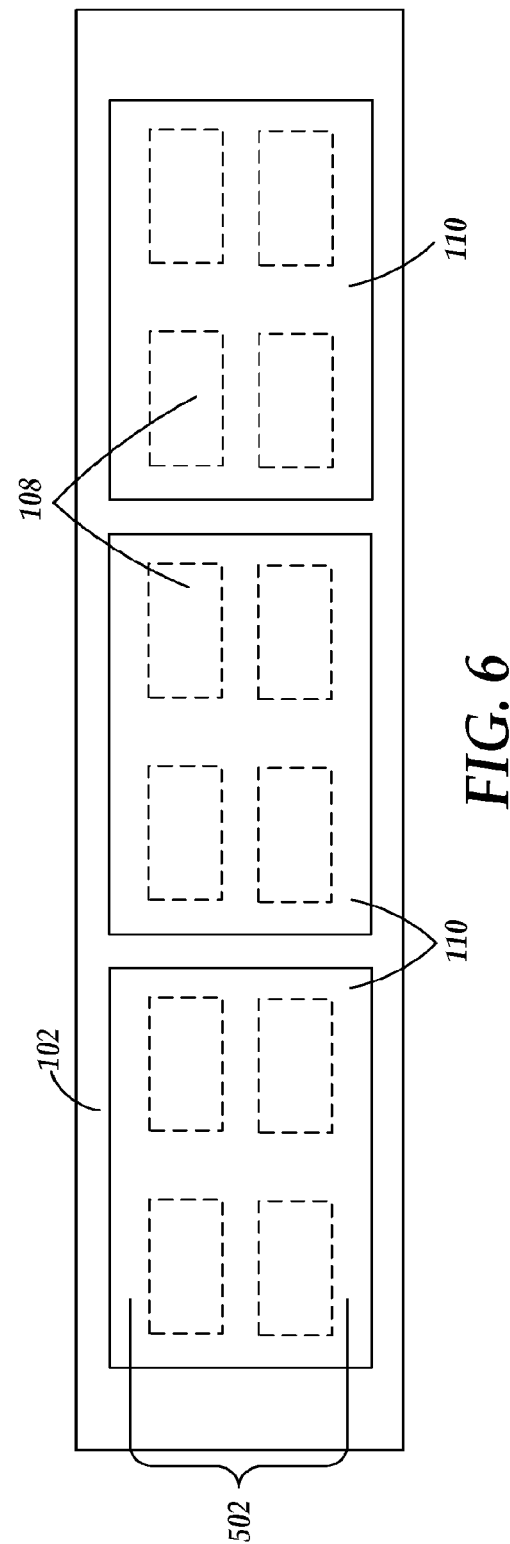

PHASE CHANGE MEMORY THERMAL MANAGEMENT WITH ELECTROCALORIC EFFECT MATERIALS

CROSS-REFERENCE TO RELATED APPLICATIONS

This application is a U.S. National Stage filing under 35 U.S.C. 371 of International Application No. PCT/US2012/055872, filed on 18 Sep. 2012. This application is related to co-pending International Application No. PCT/US2010/039200, entitled, "Electrocaloric Effect Materials and Thermal Diodes," filed on 18 Jun. 2010, and to the corresponding U.S. National Stage filing, application Ser. No. 12/999,684, entitled "Electrocaloric Effect Materials and Thermal Diodes," filed on 17-Dec.-2010, each of which is herein incorporated by reference in its entirety.

BACKGROUND

Unless otherwise indicated herein, the materials described in this section are not prior art to the claims in this application and are not admitted to be prior art by inclusion in this section.

Phase change memory (PCM) is a type of non-volatile memory that takes advantage of the characteristics of a phase change material such as chalcogenide glass to store data. Electrical currents may be applied to create heat that switches the chalcogenide glass between crystalline and amorphous states. Example PCM structures may include an array of cells of phase change material such as chalcogenide glass. Each cell may include electrodes that enable electrical current to be selectively applied for a predetermined duration to create a temperature increase that initiates a state change of the phase change material within the cell. The corresponding change in electrical resistance of the phase change material may be detected and correlated with a particular binary value. In this manner, data may be written and erased from the cells within the PCM structure through the manipulation of the electrical resistance of the material within the cell via the controlled application of heat.

As heat is applied to one cell of an array during an operation, the heat from that cell may transfer, or spillover, to a neighboring cell. This thermal spillover may unintentionally create a phase change within the neighboring cell or otherwise affect the electrical resistance of the material within the neighboring cell in a way as to create ambiguity in the binary value intended for that cell. Moreover, the speed of memory read and write operations of PCM technology is affected by the heating and cooling speeds of the phase change material within the cells, which may be impacted by temperature, and consequently by neighboring cell heat discharge or thermal spillover.

SUMMARY

The present disclosure generally describes techniques for managing thermal energy within a PCM structure. According to some example embodiments, a PCM thermal management system may include a number of PCM cells that are each reconfigurable between a first state and a second state with the application of thermal energy. An electrocaloric effect (ECE) material segment may be thermally coupled to at least one PCM cell. Electrodes may be positioned effective to apply an electric field across the electrocaloric effect material segment. A controller may be operative to control the application of the electric field from a power source to the electrodes in coordination with a state change of the PCM cell.

The present disclosure also generally describes methods that may be employed to manage excess heat within a PCM structure. Some example methods may include providing a phase change signal to a PCM cell, increasing the temperature within the PCM cell until excess heat emanates from the PCM cell. An electric field may be provided in coordination with the phase change signal to an electrocaloric effect material segment that is thermally coupled to the PCM cell. The electric field may be effective to activate the electrocaloric effect material segment to transfer the excess heat to the electrocaloric effect material segment.

The present disclosure further generally describes a PCM thermal management system that may include an array of PCM cells, and a number of electrocaloric effect material segments. Each PCM cell may be reconfigurable between a first state and a second state via the application of thermal energy. Each electrocaloric effect material segment may be thermally coupled to a row or column of PCM cells within the array. Electrodes may be positioned to apply an electric field across each electrocaloric effect material segment. A controller may be operative to coordinate the application of the electric field from a power source to each electrocaloric effect material segment with the application of a phase change signal to a PCM cell within the row or column in thermal contact with the electrocaloric effect material segment.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 5 is a block diagram of an example configuration of an array of PCM cells grouped into subsets that are each thermally coupled with an electrocaloric effect material segment;

FIG. 6 is a block diagram of an example alternative configuration of an array of PCM cells grouped into subsets that are each thermally coupled with an electrocaloric effect material segment;

DETAILED DESCRIPTION

Figure 1:
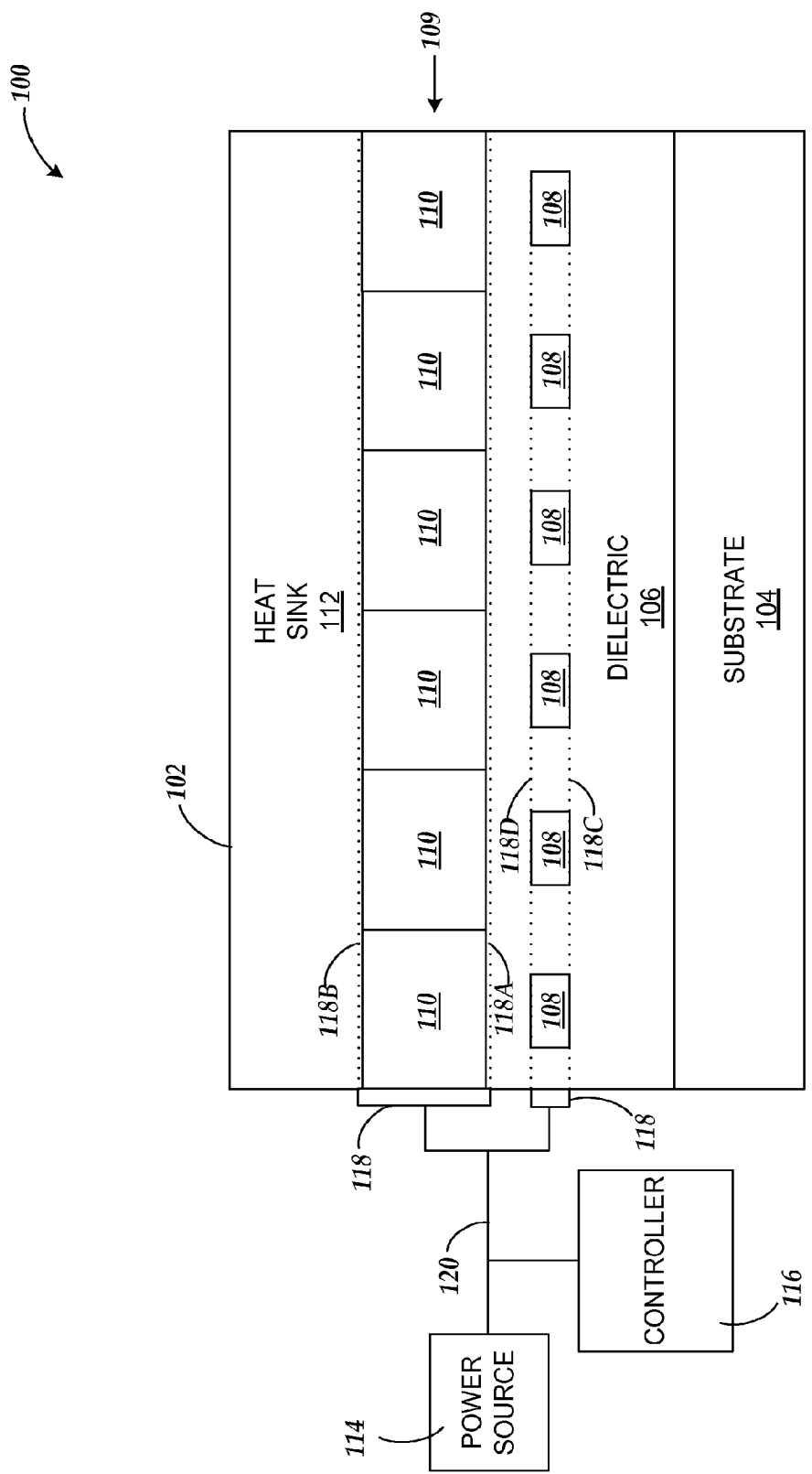
FIG. 1 is a functional block diagram illustrating an example PCM thermal management system.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to utilizing electrocaloric effect heat transfer techniques to effectively transfer excess heat away from activated phase change material within a PCM structure. The term "active" may be used throughout this disclosure to refer to a PCM cell or corresponding phase change material that is being subjected to relatively higher temperatures from an electrical current or other heat source as compared to an "inactive" cell or phase change material in which heat is not being applied. The present application identifies that conventional PCM structures may suffer from the effects of excess heat spillover from active cells to neighboring inactive cells. For the purpose of this disclosure, the active cell that is creating the excess heat spillover may be referred to as the "aggressor" cell, while any neighboring cell that may be receiving the excess heat may be referred to as a "victim" cell. Because of the effects of the excess heat from aggressor cells on victim cells, the capability to reduce the size of conventional PCM structures may be limited by a cell density that provides adequate spacing between cells to allow for simultaneous activation of neighboring cells without producing undesirable temperatures with corresponding negative consequences within the PCM structure.

In some illustrative implementations described herein, a PCM thermal management system may include a layer of electrocaloric effect material arranged in thermal contact with an array of PCM cells within a PCM structure. The electrocaloric effect material may be configured into any number of segments, with each segment being arranged in thermal contact with any number of PCM cells. An electrocaloric effect material segment may be configured for activation in coordination with the activation of the PCM cells to which the electrocaloric effect material segment is thermally coupled. Activation of the electrocaloric effect material segment can change the temperature of the material, influencing where excess heat flows. Because the activation of the electrocaloric effect material segments and the PCM cells is coordinated, excess heat from an aggressor cell may be transferred through the electrocaloric effect material segment rather than spilling over into a neighboring victim cell where the operations of the victim cell could be impacted.

FIG. 1 is a functional block diagram illustrating an example PCM thermal management system 100, arranged in accordance with at least some embodiments described herein.

The PCM thermal management system 100 may include a PCM structure 102 coupled to a power source 114 and controller 116. The PCM structure 102 may include a substrate 104, such as silicon or other semiconductor or compound semiconductor material such as gallium arsenide (GaAs) or group III-V or II-VI semiconductors. A dielectric 106 may be coupled to the substrate 104 and may contain any number of PCM cells 108. Any suitable dielectric material may be used, including but not limited to, silicon dioxide, hafnium silicate, zirconium silicate, hafnium dioxide, zirconium dioxide, oxynitride, and nitrided hafnium silicates.

The PCM cells 108 include a phase change material, such as a chalcogenide glass. Any suitable phase change material may be used for reversibly switching between states, and correspondingly altering the electrical resistances of the material, according to varying thermal input. Example phase change material may include, but is not limited to, lead zircanate titanate (PZT), poly(vinylidene fluoride-trifluoroethylene) (P(VDF-TrFE)), and poly(vinylidene fluoride-trifluoroethylene-chlorofluoroethylene) (P(VDF-TrFE-CFE)), as well as pyroelectric material. The PCM cells 108 may be separated by the dielectric 106 and may have a dielectric cap, so that they are substantially encompassed by the dielectric 106 as shown in FIG. 1.

The PCM structure 102 may additionally include a heat sink 112, which may be a silicon cap or other suitable material, including but not limited to, brass, copper, aluminum, grease connection to a heat pipe, or the like. According to various example configurations of the PCM structure 102, an electrocaloric effect material layer 109 may be positioned between the dielectric 106 with PCM cells 108 and the heat sink 112. Electrocaloric effect material may be capable of dropping in temperature approximately between about 7 to about 35 degrees C. within nanoseconds, depending on the material, when subjected to an electric field. For example, ceramic lead zirconate titanate (PZT) may experience a temperature change of 7° C. in response to an applied voltage, while ferroelectric polymers such as P(VDF-TrFE-CFE) may experience a temperature change in excess of about 30° C.

The electrocaloric effect material layer 109 may include any number of electrocaloric effect material segments 110. As will be described in greater detail below, the electrocaloric effect material layer 109 may include an electrocaloric effect material segment 110 per PCM cell 108, an electrocaloric effect material segment 110 per row or column of PCM cells 108 within an array of cells, or may include an electrocaloric effect material segment 110 per any other desired grouping of PCM cells 108 of any number and arrangement.

A power source 114 can be electrically coupled to the PCM structure 102 via electrodes 118. In some examples, an electrode control signal may be applied to the electrodes 118A and 118B within the PCM structure 102 from the power source 114. The electrode control signal may be effective to generate an electric field across the associated electrocaloric effect material. The electrode control signal may be any type of signal that is effective to produce the desired temperature change within the electrocaloric effect material that transfers excess heat away from the PCM cells 108. According to one implementation, the electrode control signal may be an oscillating signal (e.g., a voltage or current). The oscillating signal may be provided as any of a variety of waveforms. In some examples, the oscillating signal may be provided as a pulsed signal with a direct current (DC) signal of specified amplitude that is pulsed on or off (or simply between an upper voltage and lower voltage) with a specified duty cycle and timing. In some additional examples, the oscillating signal may be provided as a sinusoidal signal with an alternating current (AC)

signal of a specified amplitude, frequency, phase and DC offset. In still additional examples, the oscillating signal may be provided as a ramped or sawtooth signal with a specified amplitude, rate, period and DC offset. In still other examples, the oscillating signal may be provided as a triangular signal with a specified amplitude, first ramp rate (e.g., increasing), second ramp rate (e.g., decreasing), period, and DC offset. Additional waveforms or combinations of waveforms are also contemplated.

The electrodes 118A and 118B are represented in FIG. 1 by broken lines proximate to opposing surfaces of the electrocaloric effect material layer 109. It should be appreciated that any number and type of electrodes 118A and 118B may be positioned throughout the various electrocaloric effect material segments 110 to subject the various electrocaloric effect material segments 110 to electrical fields provided by the power source 114. For example, according to one implementation, a grounding electrode 118A may be provided for the electrocaloric effect material layer 109 as represented by the broken line between the electrocaloric effect material layer 109 and the dielectric 106. A segmented electrode 118B may be provided for the electrocaloric effect material layer 109 as represented by the broken line between the electrocaloric effect material layer 109 and the heat sink 112. The segmented electrode 118B may be configured to selectively apply an electric field to any single electrocaloric effect material segment 110 or group or subset of electrocaloric effect material segments 110. The electrodes 118A and 118B and corresponding electrocaloric effect material are further described and illustrated in application serial number PCT/US2010/039200, entitled, "Electrocaloric Effect Materials and Thermal Diodes," filed on 18 Jun. 2010, and corresponding U.S. National Phase filing, U.S. application Ser. No. 12/999,684, entitled "Electrocaloric Effect Materials and Thermal Diodes," filed on 17 Dec. 2010, each of which is herein incorporated by reference in its entirety.

The electrodes 118 may additionally include electrodes 118C and 118D positioned within the PCM structure 102 and configured to selectively provide a phase change signal to the PCM cells 108. The phase change signal may provide the current or other heat generating signal capable of providing a controlled duration of heat to activate the phase change material within a PCM cell 108 and initiate the desired change of phase corresponding to a write or erase operation. The characteristics (e.g., voltage or waveform) of the phase change signal provided by electrodes 118C and 118D may differ from the characteristics of the electrode control signal provided by electrodes 118A and 118B. The electrodes 118C and 118D are represented in FIG. 1 by broken lines proximate to opposing surfaces of the PCM cells 108. It should be appreciated that any number and type of electrodes 118C and 118D may be positioned throughout the various PCM cells 108 to subject the phase change material to temperatures sufficient to perform the desired memory operations. Specifically, although only two electrodes 118C and 118D are shown, each PCM cell 108 may have electrodes 118 capable of providing a phase change signal independent from signals provided to other PCM cells 108.

According to one example, the electrodes 118A and 118D may be configured as one electrode 118 shared between the electrocaloric effect material layer 109 and the PCM cells 108. This implementation may be appropriate when the PCM structure 102 is configured so that the phase control signal that activates one or more PCM cells 108 and the electrode control signal that activates one or more electrocaloric effect material segments 110 are the same signal. Alternatively, the one electrode 118 shared between the electrocaloric effect material layer 109 and the PCM cells 108 may be the ground. Various configurations of the PCM thermal management system 100 that illustrate examples of the coordination between the activation of the electrocaloric effect material layer 109 and the activation of the PCM cells 108 will be described in greater detail below.

The PCM thermal management system 100 may include a controller 116 that is operative to control the electrode control signal applied to the electrodes 118 from the power source 114 to create the desired electric fields that drive the transfer of excess heat away from the PCM cells 108. It should be appreciated that alternative embodiments may utilize magnetic fields rather than the electric fields described herein. According to these alternative embodiments, the electrocaloric effect material layer 109 may include a layer of material having magnetocaloric effect properties that transfer excess heat in response to the magnetic fields in a manner similar to that described herein with respect to the transfer of excess heat through the electrocaloric effect material layer 109 in response to the associated electric fields. The magnetic fields may be utilized to bias the electrocaloric effect material layer 109 when no electric field is present, or to tune the electrode control signal as desired.

The controller 116 may additionally be operative to control the phase control signal that activate the phase change material within a PCM cell 108 during memory operations, as well as the coordination between the electrode control signal and the phase change signal. The controller 116 may include any type of computer hardware and/or software capable of providing the electrode control signal and phase control signal at the desired waveform characteristics. The controller 116, as arranged in accordance with at least some embodiments will be described in greater detail below with respect to FIG. 8.

Circuitry 120 may be configured to couple the power source 114, controller 116, and electrodes 118 in a suitable manner to provide and coordinate the electrode control signal and phase change signals to effectively remove the excess heat within the PCM structure 102 as described herein. It should be appreciated that there may be additional circuitry and other components within the PCM thermal management system 100 and PCM structure 102 that are not shown in FIG. 1 and the other Figures. These components and circuitry are contemplated and considered within the scope of the concepts described herein.

Figures 2A, 2B:
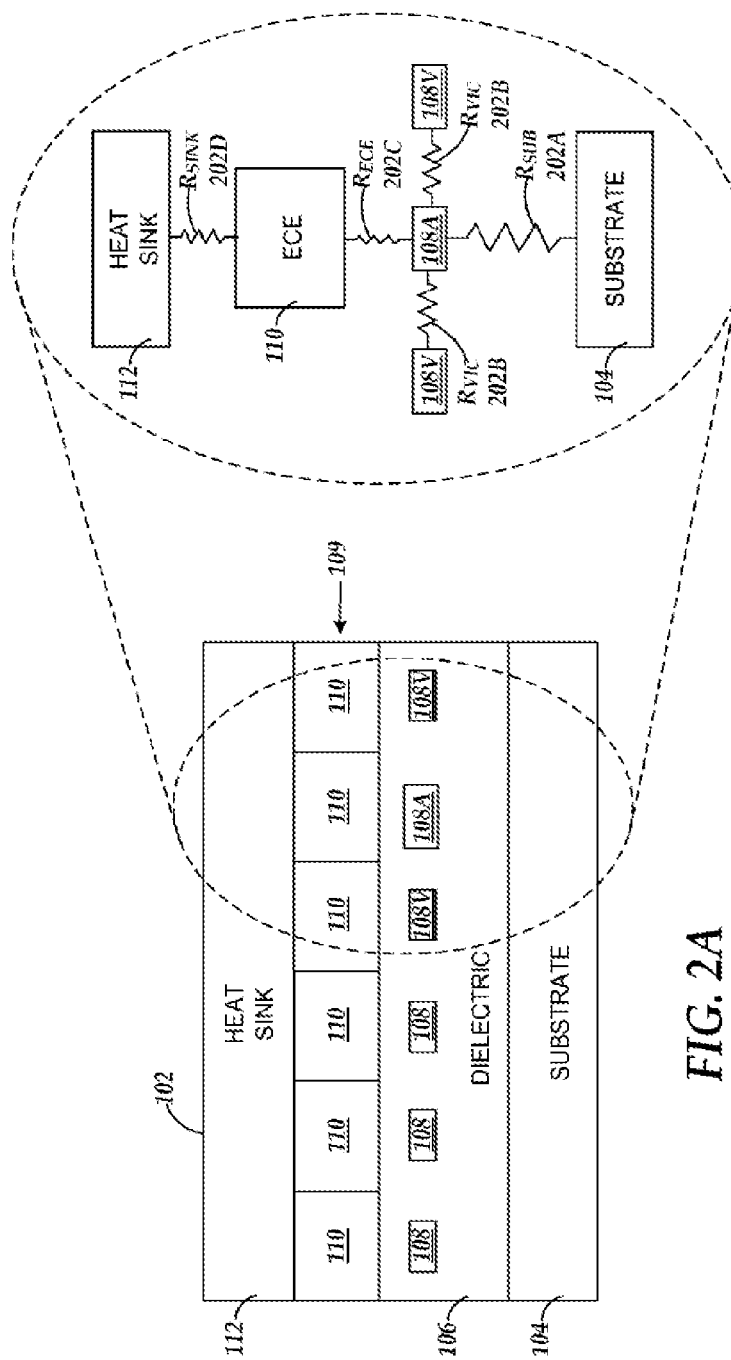
FIG. 2A is a block diagram illustrating an example PCM structure.
FIG. 2B is an enlarged view of a portion of the PCM structure of FIG. 2A showing the relationship of various components of the PCM structure with respect to thermal resistances of the components.

FIG. 2A is a block diagram illustrating an example PCM structure 102, arranged in accordance with at least some embodiments described herein. For illustrative purposes, this diagram and the enlargement shown in FIG. 2B will be used to illustrate the flow of excess heat through a PCM structure 102 from a PCM cell 108 that has been activated. Specifically, FIG. 2B is an enlarged view of a portion of the PCM structure 102 of FIG. 2A showing the relationship of various components of the PCM structure 102 with respect to thermal resistances of the components. According to this example, aggressor cell 108A includes phase change material that has been activated by a phase change signal. As a result, the phase change material can transition between two states and the temperature within the aggressor cell 108A can increase until excess heat emanates from the cell. The neighboring cells adjacent to the aggressor cell 108A can be referred to as victim cells 108V since they may be undesirably impacted by the excess heat spilling over from the aggressor cell 108A.

The excess heat from the aggressor cell 108A may spread in any direction according, at least in part, to the thermal resistances of the surrounding materials. The victim cells 108V may be affected by the aggressor cell 108A according to the ratio that the thermal resistance 202B associated with the victim cells 108V has to the other adjacent thermal resistances and the ratio of the temperature difference across those thermal resistances. For example, looking at FIG. 2B, the thermal resistance 202A associated with the substrate 104 may be larger than the thermal resistance 202B associated with the victim cells 108V. This characteristic may result because the lateral spacing of the victim cells 108V with respect to the aggressor cell 108A may be greater than the spacing from the aggressor cell 108A to the substrate 104.

According to an illustrative example, the lateral spacing between PCM cells 108 may be in a range of about 0.7-0.35 micrometers versus a spacing of about 1-2 micrometers between the PCM cells 108 and the substrate 104. In this example, the thermal resistance 202A per unit area associated with the substrate 104 may be approximately twice the thermal resistance 202B per unit area of the victim cells 108V, which can result in excess heat from the aggressor cell 108A spreading to the victim cells 108V. The thermal resistance 202D associated with the heat sink 112 may be larger than the thermal resistance 202B associated with the victim cells 108V, which may not adequately limit or prevent the excess heat spillover into the victim cells 108V.

To alleviate the thermal spillover of excess heat from the aggressor cell, embodiments described herein incorporate the electrocaloric effect material layer 109 thermally coupled to the PCM cells 108. For the purposes of this disclosure, the term "thermally coupled" may refer to direct contact with the PCM cells 108 or indirect contact with the PCM cells 108 via the dielectric 106 cap positioned over the PCM cells 108 and/or conductive structures such as electrodes 118A or 118D or other circuit routing. In response to an electrode control signal, the applicable electrocaloric effect material segments 110 can activate, which can reduce the temperature of the electrocaloric effect material temporarily and increase heat transfer across the thermal resistance 202C of the electrocaloric effect material segment 110. Any dielectric 106 cap between the PCM cells 108 and the electrocaloric effect material layer 109 may be configured as a thin layer so as to increase the benefits of the reduced thermal resistance 202C of the electrocaloric effect material segment 110. For example, for illustrative purposes only, the dielectric material between the PCM cells 108 and the electrocaloric effect material layer 109 may have a depth in a range of approximately 0.1 to 0.4 micrometers. Electrodes 118 or other circuits between the electrocaloric effect material layer 109 and the PCM cells 108 may be metallic and sufficiently more thermally conductive than the silicon dioxide (or other dielectric material) and may have a minimal effect on the thermal resistance calculations.

Because the thermal resistance 202C of the electrocaloric effect material segment 110 may be substantially lower than the thermal resistance 202A associated with the substrate 104 and the thermal resistance 202B of the victim cells 108V, the excess heat from an aggressor cell 108A may be substantially drawn toward the electrocaloric effect material segment 110 rather than interfering with the victim cells 108V. As an illustrative example based on measurements of devices discussed, assume that the thermal resistance 202B of the victim cells 108V is approximately 13 times the thermal resistance 202C of the electrocaloric effect material segment 110 based on factors such as component separation, relative sizes, and material characteristics. Another way to state this relationship between the electrocaloric effect material segment 110 and the victim cells 108V is that the electrocaloric effect thermal resistance 202C may be about 13 times more thermally conductive than the victim cells 108V, which can result in approximately 13 times the heat flux per degree between the aggressor cell 108A and the electrocaloric effect material segment 110 than between the aggressor cell 108A and the victim cells 108V.

In this example, since the heat transfer is substantially proportional to temperature difference time conductivity, each degree of temperature change at the electrocaloric effect material segment 110 may result in about 13 degrees of protection at the victim cells 108V. Accordingly, for an electrocaloric effect material such as PZT that can provide approximately an 8 degree C. change in temperature in response to the electrode control signal, the victim cells 108V will be protected from up to approximately 106 degree C. of excess heat exposure from the aggressor cell 108A. Similarly, for ferroelectric electrocaloric effect materials that can provide up to a 14 degree C. change in temperature, the victim cells 108V may be protected from up to approximately 182 degree C. of excess heat exposure from the aggressor cell 108A. As new electrocaloric effect materials are developed that may allow for increasingly high degrees of temperature drops, the protection of victim cells 108V may correspondingly increase. Various PCM structures 102 are contemplated that may be developed with increased density in the arrangement of PCM cells 108, which in turn may facilitate smaller electronic devices and increased memory reliability.

Figure 3:
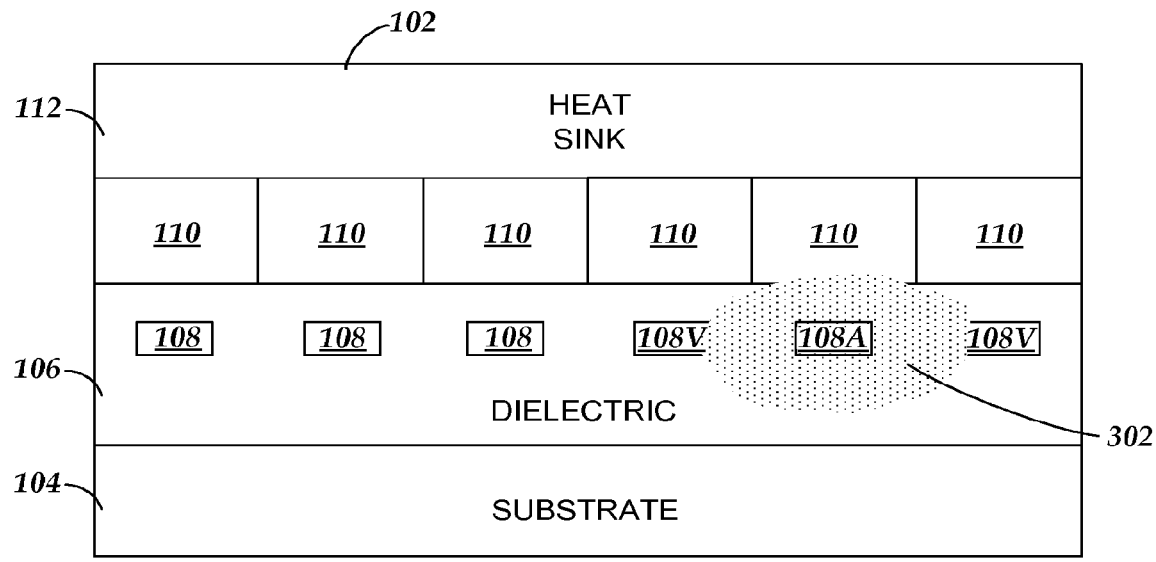
FIG. 3 is a block diagram of an example PCM structure showing excess heat emanating from an aggressor cell to adjacent victim cells without activation of an electrocaloric effect material segment.
Figure 4:
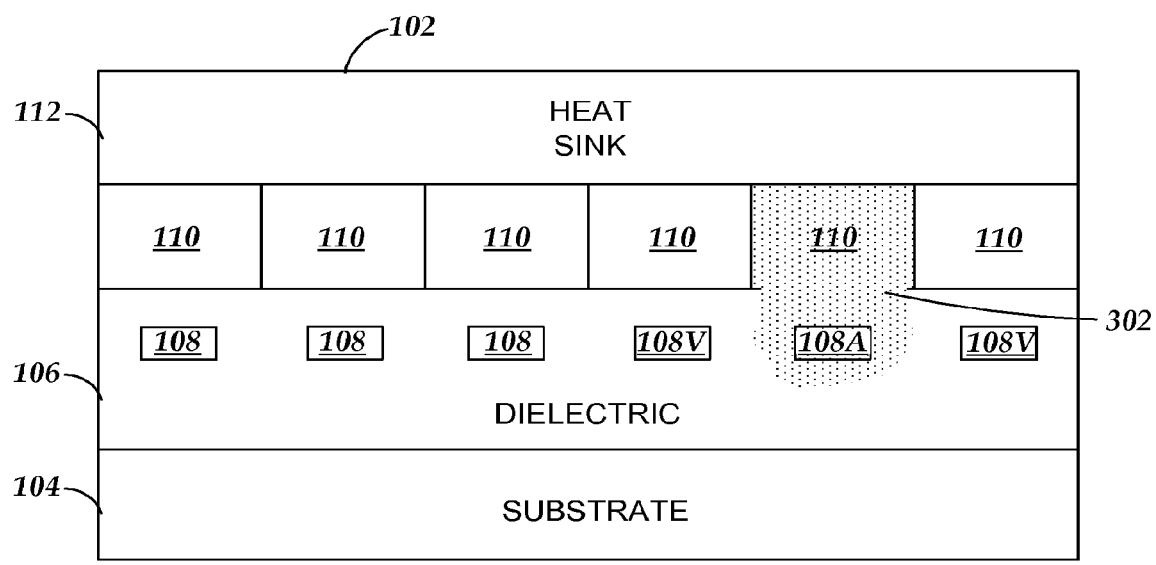
FIG. 4 is a block diagram of the example PCM structure of FIG. 3 showing excess heat from the aggressor cell transferring to the electrocaloric effect material segment upon activation of the electrocaloric effect material segment.

FIG. 3 is a block diagram of an example PCM structure 102 showing excess heat 302 emanating from an aggressor cell 108A to adjacent victim cells 108V without activation of an electrocaloric effect material segment 110, arranged in accordance with various embodiments described herein. FIG. 4 is a block diagram of the example PCM structure 102 of FIG. 3 showing excess heat 302 from the aggressor cell 108A transferring to the electrocaloric effect material segment 110 upon activation of the electrocaloric effect material segment 110, in accordance with at least some embodiments described herein. Comparing these two diagrams, it is apparent that activation of the electrocaloric effect material segment 110 may effectively transfer excess heat 302 from the aggressor cell 108A to the electrocaloric effect material segment 110 and away from the victim cells 108V surrounding the aggressor cell 108A.

According to various embodiments, the timing of the activation of the electrocaloric effect material segment 110 may be coordinated in various ways with respect to the activation of the aggressor cell 108A. According to one example embodiment, the controller 116 can be configured to activate an electrocaloric effect material segment 110 associated with an aggressor cell 108A at a predetermined time prior to the activation of the aggressor cell 108A. In this manner, the electrocaloric effect material segment 110 may be pre-cooled to establish a directional gradient of the temperature and increase the efficiency in which the excess heat 302 may be transferred away from the aggressor cell 108A once activated.

The predetermined time prior to the activation of the aggressor cell 108A in which the electrocaloric effect material segment 110 is activated may be equivalent to a thermal time constant between the aggressor cell 108A and the electrocaloric effect material segment 110. The thermal time constant according to one implementation may be determined as $1/(R_{ECE}*C_{ECE})$, $R_{ECE}$ being the thermal resistance associated with the path from the aggressor cell 108A to the electrocaloric effect material segment 110, and $C_{ECE}$ being the effective thermal capacitance of that path. It should be appreciated that the predetermined time in which pre-cooling occurs may be calculated using any desired methodology without departing from the scope of this disclosure. According to this example, the controller 116 may be configured to provide the phase change signal to the aggressor cell 108A after activating the appropriate electrocaloric effect material segment 110 for the predetermined time.

During a reset operation after the write operation or some other memory operation is complete, the electrode control signal to the electrocaloric effect material segment 110 can be removed and the excess heat can be allowed to flow out of the PCM structure 102. An example PCM memory write operation may revisit an aggressor cell 108A after approximately multiple cycles (e.g., 100) in order to allow for cooling. Accordingly, the time period associated with the reset operation for the electrocaloric effect material segment 110 may be approximately multiple times (e.g., 100) longer than the cooling operation of the electrocaloric effect material segment 110.

According to another example embodiment, the controller 116 can be configured to activate an electrocaloric effect material segment 110 associated with an aggressor cell 108A substantially simultaneously with the activation of the aggressor cell 108A. While pre-cooling the electrocaloric effect material segment 110 as discussed above may be advantageous for efficiently removing excess heat 302, in practice, doing so may add time to the memory operation. For this reason, the electrode control signal to the electrocaloric effect material segment 110 and the phase change signal to the PCM cell 108 being activated may occur at approximately the same time. One benefit of simultaneous activation includes the utilization of a shared electrode 118 as discussed above with respect to FIG. 1 to provide both signals at the same time to the respective components.

The electrocaloric effect material segments 110 may be arranged according to any number of configurations. According to one example embodiment, there may a single electrocaloric effect material segment 110 thermally coupled to each PCM cell 108. The activation of each electrocaloric effect material segment 110 may be coordinated with the activation of the corresponding PCM cell 108. One disadvantage of this configuration is that the wiring of the electrodes 118 may be complex as a separate electrode 118 would be utilized for each electrocaloric effect material segment 110 corresponding to each PCM cell 108.

According to an alternative embodiment, the PCM cells 108 of an array may be grouped in subsets of the total number PCM cells 108, with an electrocaloric effect material segment 110 thermally coupled to each subset. FIG. 5 is a block diagram of an example configuration of an array of PCM cells 108 grouped into subsets 502 that are each thermally coupled with an electrocaloric effect material segment 110, arranged in accordance with at least some embodiments described herein. This arrangement includes an electrocaloric effect material segment 110 coupled to each row or column of PCM cells 108 within the array. FIGS. 1-4 may be considered side views of a PCM structure 102, while FIG. 5 may be considered as a top view of the same PCM structure 102. In this particular example, there are six columns, or subsets 502, of PCM cells 108. Six corresponding electrocaloric effect material segments 110 may be employed, where each electrocaloric effect material segment 110 can be thermally coupled to the three PCM cells 108 of the subset 502. During memory operations, each time one or more of the three PCM cells 108 of a subset 502 are activated, the electrocaloric effect material segment 110 coupled to that subset 502 can also be activated.

The controller 116 may be configured to access each row or column to perform a memory operation before moving on to other rows or columns in a purposeful pattern designed to allow the PCM cells 108 to cool. In this example configuration, the top surface of the dielectric 106 may be coupled to a thin (i.e., 40-120 nanometers) layer of metallic electrode 118. According to one embodiment, the electrocaloric effect material segments 110 may be processed onto the electrode 118 by known methods such as polymer stamp transfer techniques. The opposing side of the electrocaloric effect material segments 110 may be held at a constant voltage so that a grounding layer or simply grounding the heat sink 112 may serve as the other electrode 118.

FIG. 6 is a block diagram of an example alternative configuration of an array of PCM cells 108 grouped into subsets 502 that are each thermally coupled with an electrocaloric effect material segment, arranged in accordance with at least some embodiments described herein. According to this example configuration, the subsets 502 of PCM cells 108 can include groupings of PCM cells 108 from multiple rows and columns. In a particular example, four PCM cells 108 can be grouped within each subset 502. An electrocaloric effect material segment 110 can be thermally coupled to each subset 502 of four PCM cells 108. It should be appreciated that any arrangement of electrocaloric effect material segments 110 and subsets 502 of PCM cells 108 may be utilized without departing from the scope of this disclosure.

Figure 7:
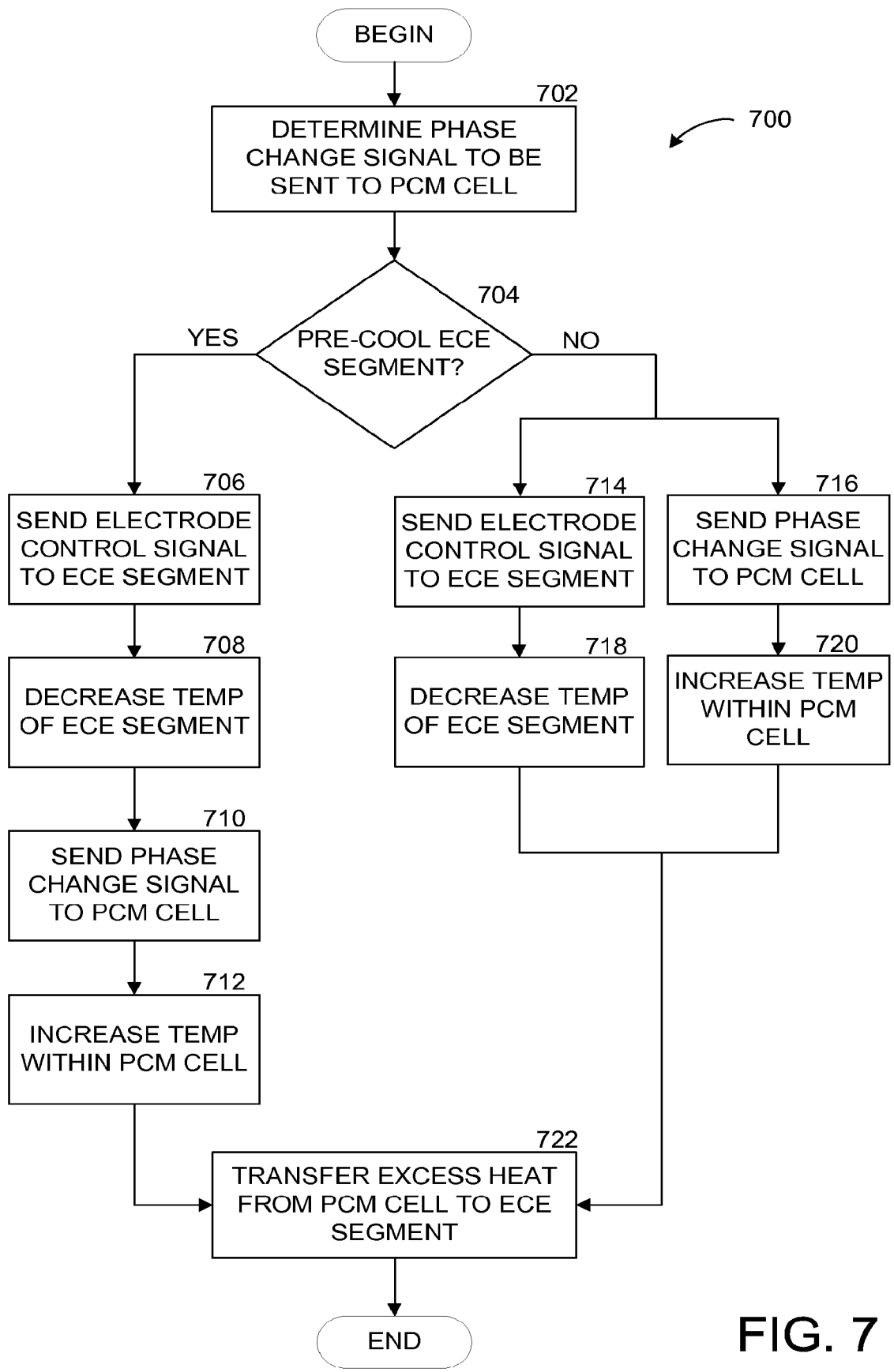
FIG. 7 is a flow diagram illustrating an example process for managing excess heat within a PCM structure.

FIG. 7 is a flow diagram illustrating an example process 700 for managing excess heat 302 within a PCM structure 102. The process 700 may include various operations, functions, or actions as illustrated by one or more of blocks 702-722. It should be appreciated that more or fewer operations may be performed than shown in the FIG. 7 and described herein. Moreover, these operations may also be performed in a different order than those described herein.

The process 700 may begin at block 702 (Determine Phase Change Signal To Be Sent To PCM Cell), where the controller 116 may be configured to determine that a memory operation is to occur with respect to one or more PCM cells 108. Block 702 may be followed by block 704 (Pre-Cool ECE Segment?), where the controller 116 may be configured to determine whether the electrocaloric effect material segment 110 corresponding to the PCM cell 108 is to be pre-cooled. As discussed above, the electrocaloric effect material segments 110 may be activated a predetermined time prior to activating the appropriate PCM cell 108 to increase the efficiency at which the excess heat 302 is transferred out of the PCM structure 102 according to one embodiment. Tf the electrocaloric effect material segment 110 is to be pre-cooled, then the process 700 may proceed from block 704 to block 706 (Send Electrode Control Signal To ECE Segment), where the controller 116 is configured to initiate the electrode control signal to the electrocaloric effect material segment 110 to activate the electrocaloric effect material.

Process 700 may proceed from block 706 to block 708 (Decrease Temp Of ECE Segment), where the temperature of the electrocaloric effect material segment 110 can decrease in response to the field created by the electrode control signal. At the predetermined time period after sending the electrode control signal to the electrocaloric effect material segment 110, the controller 116 can initiate the phase change signal to the PCM cell 108 to initiate the memory write operation at block 710 (Send Phase Change Signal To PCM Cell). As discussed above, the predetermined time period may be a thermal time constant associated with the heat flow path.

Block 710 can be followed by block 712 (Increase Temp Within PCM Cell), where the temperature of the phase change material within the PCM cell 108 can increase in response to the phase change signal as the phase change material transitions between a first state and a second state. Block 712 can be followed by block 722 (Transfer Excess Heat From PCM Cell To ECE Segment), where the excess heat 302 from the active PCM cell 108 can be transferred to the electrocaloric effect material segment 110 due to the increased temperature drop across thermal resistivity 202C of the electrocaloric effect material segment 110. The process may terminate after block 722, or return to block 702 for additional operations.

Returning to block 704 (Pre-Cool ECE Segment?), if the electrocaloric effect material segment 110 is not to be pre-cooled, then the process 700 can proceed in parallel from block 704 to block 714 (Send Electrode Control Signal To ECE Segment) and to block 716 (Send Phase Change Signal To PCM Cell). The controller 116 can be configured, in some examples, to simultaneously initiate the electrode control signal and the phase change signal to initiate the memory write operation, where the electrode control signal is effective to activate the electrocaloric effect material, while the phase change signal is effective to activate the PCM cell. The process 700 can continue substantially simultaneously from blocks 714 and 716 to blocks 718 (Decrease Temp Of ECE Segment) and 720 (Increase Temp Within PCM Cell), respectively. At block 718, the temperature of the electrocaloric effect material segment 110 can be decreased in response to the electric field initiated by the electrode control signal. At block 720, the temperature of the phase change material within the PCM cell 108 can increase in response to the phase change signal as the phase change material transitions between states. Blocks 718 and 722 may be followed by block 722 (Transfer Excess Heat From PCM Cell To ECE Segment), where the excess heat 302 from the active PCM cell 108 can be transferred to the electrocaloric effect material segment 110 due to the decreased thermal resistivity 202C of the electrocaloric effect material segment 110.

Figure 8:
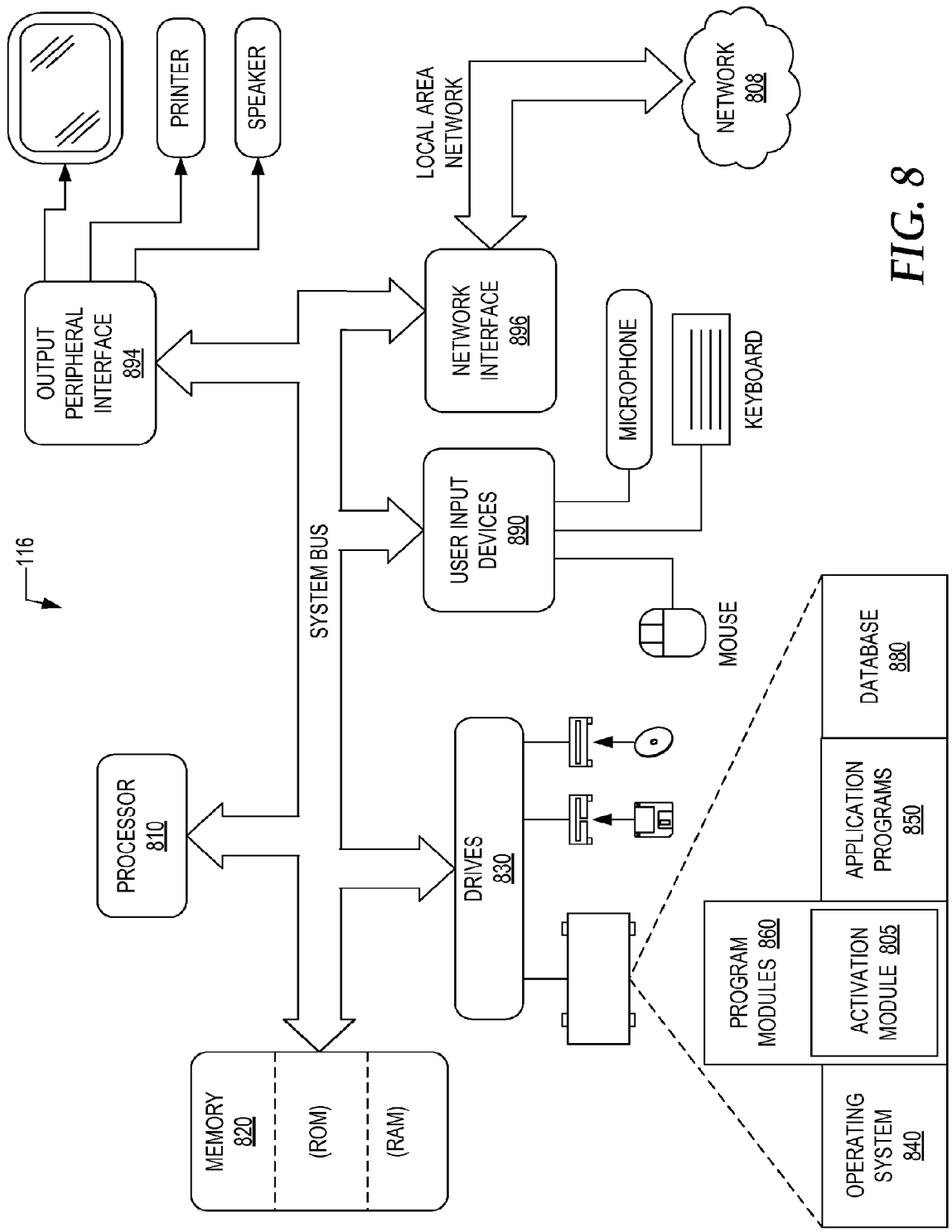
FIG. 8 is a block diagram illustrating a computer hardware architecture corresponding to an example controller, all arranged in accordance with at least some embodiments described herein.

FIG. 8 is a block diagram illustrating a computer hardware architecture that may correspond to an example controller 116 configured in accordance with at least some embodiments presented herein. FIG. 8 includes a controller 116, including a processor 810, memory 820 and one or more drives 830. The controller 116 may be implemented as a conventional computer system, an embedded control computer, a laptop, or a server computer, a mobile device, a set-top box, a kiosk, a vehicular information system, a mobile telephone, a customized machine, or other hardware platform.

The drives 830 and their associated computer storage media, provide storage of computer readable instructions, data structures, program modules and other data for the controller 116. The drives 830 can include an operating system 840, application programs 850, program modules 860, and a database 880. The program modules 860 may include an activation module 805. The activation module 805 may be adapted to execute the process 700 for implementing a PCM thermal management system 100 to remove excess heat from active PCM cells 108 during memory operations as described in greater detail above (e.g., see previous description with respect to one or more of FIGS. 1-7). The controller 116 may further include user input devices 890 through which a user may enter commands and data. Input devices can include an electronic digitizer, a microphone, a keyboard and pointing device, commonly referred to as a mouse, trackball or touch pad. Other input devices may include a joystick, game pad, satellite dish, scanner, or the like.

These and other input devices can be coupled to the processor 810 through a user input interface that is coupled to a system bus, but may be coupled by other interface and bus structures, such as a parallel port, game port or a universal serial bus ("USB"). Computers such as the controller 116 may also include other peripheral output devices such as speakers, which may be coupled through an output peripheral interface 894 or the like.

The controller 116 may operate in a networked environment using logical connections to one or more computers, such as a remote computer coupled to a network interface 896. The remote computer may be a personal computer, a server, a router, a network PC, a peer device or other common network node, and can include many or all of the elements described above relative to the controller 116. Networking environments are commonplace in offices, enterprise-wide area networks ("WAN"), local area networks ("LAN"), intranets, and the Internet.

When used in a LAN or WLAN networking environment, the controller 116 may be coupled to the LAN through the network interface 896 or an adapter. When used in a WAN networking environment, the controller 116 typically includes a modem or other means for establishing communications over the WAN, such as the Internet or the network 808. The WAN may include the Internet, the illustrated network 808, various other networks, or any combination thereof. It will be appreciated that other mechanisms of establishing a communications link, ring, mesh, bus, cloud, or network between the computers may be used.

According to some embodiments, the controller 116 may be coupled to a networking environment. The controller 116 may include one or more instances of a physical computer-readable storage medium or media associated with the drives 830 or other storage devices. The system bus may enable the processor 810 to read code and/or data to/from the computer-readable storage media. The media may represent an apparatus in the form of storage elements that are implemented using any suitable technology, including but not limited to semiconductors, magnetic materials, optical media, electrical storage, electrochemical storage, or any other such storage technology. The media may represent components associated with memory 820, whether characterized as RAM, ROM, flash, or other types of volatile or nonvolatile memory technology. The media may also represent secondary storage, whether implemented as the storage drives 830 or otherwise. Hard drive implementations may be characterized as solid state, or may include rotating media storing magnetically-encoded information.

The storage media may include one or more program modules 860. The program modules 860 may include software instructions that, when loaded into the processor 810 and executed, transform a general-purpose computing system into a special-purpose computing system. As detailed throughout this description, the program modules 860 may provide various tools or techniques by which the controller 116 may participate within the overall systems or operating environments using the components, logic flows, and/or data structures discussed herein.

The processor 810 may be constructed from any number of transistors or other circuit elements, which may individually or collectively assume any number of states. More specifically, the processor 810 may operate as a state machine or finite-state machine. Such a machine may be transformed to a second machine, or specific machine by loading executable instructions contained within the program modules 860. These computer-executable instructions may transform the processor 810 by specifying how the processor 810 transitions between states, thereby transforming the transistors or other circuit elements constituting the processor 810 from a first machine to a second machine. The states of either machine may also be transformed by receiving input from the one or more user input devices 890, the network interface 896, other peripherals, other interfaces, or one or more users or other actors. Either machine may also transform states, or various physical characteristics of various output devices such as printers, speakers, video displays, or otherwise.

Encoding the program modules 860 may also transform the physical structure of the storage media. The specific transformation of physical structure may depend on various factors, in different implementations of this description. Examples of such factors may include, but are not limited to: the technology used to implement the storage media, whether the storage media are characterized as primary or secondary storage, and the like. For example, if the storage media are implemented as semiconductor-based memory, the program modules 860 may transform the physical state of the semiconductor memory 820 when the software is encoded therein. For example, the software may transform the state of transistors, capacitors, or other discrete circuit elements constituting the semiconductor memory 820.

As another example, the storage media may be implemented using magnetic or optical technology such as drives 830. In such implementations, the program modules 860 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. It should be appreciated that various other transformations of physical media are possible without departing from the scope and spirit of the present description.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A phase change memory (PCM) thermal management system, comprising:
   a plurality of PCM cells, each reconfigurable between a first state and a second state via application of thermal energy;
   at least one electrocaloric effect material segment thermally coupled to at least one PCM cell included in the plurality of PCM cells;
   at least two electrodes positioned to apply a field across the at least one electrocaloric effect material segment in response to application of a signal across the at least two electrodes; and
   a controller operative to control the application of the field across the at least two electrodes in coordination with a state change of the at least one PCM cell.

2. The PCM thermal management system of claim 1, wherein the at least one electrocaloric effect material segment thermally coupled to the at least one PCM cell comprises a plurality of electrocaloric effect material segments coupled to the plurality of PCM cells such that each of the plurality of PCM cells is in thermal contact with a separate one of the plurality of electrocaloric effect material segments.

3. The PCM thermal management system of claim 1, wherein the plurality of PCM cells comprises a plurality of subsets of PCM cells, each of the plurality of subsets of the PCM cells comprises multiple PCM cells, and wherein the at least one electrocaloric effect material segment thermally coupled to the at least one PCM cell comprises an electrocaloric effect material segment per each of the plurality of subsets of the PCM cells such that each of a plurality of electrocaloric effect material segments is in thermal contact with each of the multiple PCM cells of a corresponding one of the plurality of subsets of the PCM cells.

4. The PCM thermal management system of claim 3, wherein the plurality of PCM cells are arranged according to an array that has a plurality of rows and columns, and wherein the plurality of subsets of the PCM cells are configured according to rows or columns of PCM cells such that each of the plurality of electrocaloric effect material segments is in thermal contact with a corresponding plurality of PCM cells that occupy a corresponding one of the plurality of rows or columns of the array.

5. The PCM thermal management system of claim 3, wherein the plurality of PCM cells are arranged according to an array that has a plurality of rows and columns, and wherein at least one of the plurality of subsets of the PCM cells comprises a portion of at least two rows and a portion of at least two columns of the plurality of rows and columns.

6. The PCM thermal management system of claim 1, further comprising a heat sink thermally coupled to the at least one electrocaloric effect material segment and configured to receive heat from the at least one electrocaloric effect material segment.

7. The PCM thermal management system of claim 6, wherein the heat sink comprises a silicon cap.

8. The PCM thermal management system of claim 1, wherein the controller operative to control the application of the field across the at least two electrodes in coordination with the state change of the at least one PCM cell comprises a controller operative to control the application of the field across the at least two electrodes a specific time prior to the state change of the at least one PCM cell.

9. The PCM thermal management system of claim 8, wherein the specific time comprises approximately a thermal time constant between the at least one PCM cell and the at least one electrocaloric effect material segment.

10. The PCM thermal management system of claim 1, wherein the controller operative to control the application of the field across the at least two electrodes in coordination with the state change of the at least one PCM cell comprises a controller operative to control the application of the field across the at least two electrodes approximately simultaneously with the state change of the at least one PCM cell.

11. The PCM thermal management system of claim 10, further comprising circuitry that electrically couples a power source to the at least one PCM cell and to the at least two electrodes such that a phase change signal provided to the at least one PCM cell from the power source to initiate the state change is provided to the at least two electrodes to apply the field to the at least one electrocaloric effect material segment.

12. A method to manage excess heat within a phase change memory (PCM) structure, the method comprising:
   providing, by a controller, a phase change signal to a PCM cell;
   in response to the phase change signal, increasing a temperature within the PCM cell such that excess heat emanates from the PCM cell;
   applying, by a controller, a field in coordination with the phase change signal to an electrocaloric effect material segment thermally coupled to the PCM cell;
   in response to applying the field to the electrocaloric effect material segment, transferring the excess heat to the electrocaloric effect material segment.

13. The method of claim 12, further comprising:
   determining that the phase change signal is to be applied; and
   wherein applying the field includes:
       in response to determining that the phase change signal is to be applied, applying the field to the electrocaloric effect material segment a specific time prior to providing the phase change signal to the PCM cell.

14. The method of claim 13, wherein the specific time comprises approximately a thermal time constant between the PCM cell and the electrocaloric effect material segment.

15. The method of claim 12, wherein providing the phase change signal and applying the field occurs substantially simultaneously.

16. The method of claim 12, further comprising thermally coupling each electrocaloric effect material segment of a plurality of electrocaloric effect material segments to an individual PCM cell within an array of PCM cells.

17. The method of claim 12, further comprising thermally coupling the electrocaloric effect material segment to a subset of PCM cells within an array of PCM cells.

18. A phase change memory (PCM) thermal management system, comprising:
   an array of PCM cells arranged according to rows and columns, wherein each PCM cell of the array of PCM cells is reconfigurable between a first state and a second state via application of thermal energy;
   a plurality of electrocaloric effect material segments, wherein each electrocaloric effect material segment of the plurality of electrocaloric effect material segments is thermally coupled to either a row or column of PCM cells within the array of PCM cells;
   at least two electrodes positioned to apply a field across each electrocaloric effect material segment; and
   a controller coupled to the at least two electrodes and configured to coordinate the application of the field across an electrocaloric effect material segment of the plurality of electrocaloric effect material segments with application of a phase change signal to a PCM cell of the array of PCM cells, wherein the PCM cell is in thermal contact with the electrocaloric effect material segment.

19. The PCM thermal management system of claim 18, wherein the controller operative to coordinate the application of the field with the application of the phase change signal comprises a controller operative to coordinate the application of the field with the application of the phase change signal such that the field is applied a thermal time constant prior to the application of the phase change signal to the PCM cell.

20. The PCM thermal management system of claim 18, wherein the controller operative to coordinate the application of the field with the application of the phase change signal comprises a controller operative to coordinate the application of the field with the application of the phase change signal such that the field is applied approximately simultaneously with the application of the phase change signal to the PCM cell.

* * * * *

UNITED STATES PATENT AND TRADEMARK OFFICE
CERTIFICATE OF CORRECTION

PATENT NO.       : 9,318,192 B2
APPLICATION NO.  : 13/810324
DATED            : April 19, 2016
INVENTOR(S)      : Kruglick Page 1 of 1

It is certified that error appears in the above-identified patent and that said Letters Patent is hereby corrected as shown below:

On the Title Page, in item (71), under "Applicant", in Column 1, Line 2, delete "Wilmington (DE)" and insert -- Wilmington, DE (US) --, therefor.

In the Specification

In Column 1, Line 9, delete "371" and insert -- § 371 --, therefor.

Signed and Sealed this
Second Day of August, 2016

Michelle K. Lee
*Director of the United States Patent and Trademark Office*